United States Patent [19]

Neilson et al.

[11] Patent Number: 5,422,288

[45] Date of Patent: Jun. 6, 1995

[54] METHOD OF DOPING A JFET REGION IN A MOS-GATED SEMICONDUCTOR DEVICE

[75] Inventors: John M. S. Neilson, Norristown; Christopher L. Rexer, Mountaintop; Carl F. Wheatley, Jr., Drums, all of Pa.

[73] Assignee: Harris Corporation, Melbourne, Fla.

[21] Appl. No.: 246,307

[22] Filed: May 19, 1994

[51] Int. Cl.$^6$ .................................. H01L 21/265
[52] U.S. Cl. ................................ 437/29; 437/144; 437/953
[58] Field of Search ............... 257/135, 139, 263, 329; 437/27, 29, 149, 953; 148/DIG. 18

[56] References Cited

U.S. PATENT DOCUMENTS

| | | | |
|---|---|---|---|
| 4,376,286 | 3/1983 | Lidow et al. | 357/23 |
| 4,810,665 | 3/1989 | Chang et al. | 437/27 |
| 5,016,066 | 5/1991 | Takahashi | 357/23.4 |
| 5,028,552 | 7/1991 | Ushiku | 437/41 |
| 5,055,895 | 10/1991 | Akiyama et al. | 257/335 |
| 5,248,627 | 9/1993 | Williams | 437/149 |

*Primary Examiner*—George Fourson
*Assistant Examiner*—Thomas G. Bilodeau
*Attorney, Agent, or Firm*—Rogers & Killeen

[57] ABSTRACT

A MOS-gated semiconductor device may be manufactured by a process in which the neck region of the device is doped through a previously deposited polysilicon gate. In the method of the present invention, the dopant in the neck region of the device is not subjected to the same temperature history as the body dopant, thereby providing means to increase the ruggedness of the device and providing means by which the threshold voltage of the device may be controlled.

7 Claims, 2 Drawing Sheets

METHOD OF DOPING A JFET REGION IN A MOS-GATED SEMICONDUCTOR DEVICE

BACKGROUND OF THE INVENTION

The present invention relates to a method of manufacturing of MOS-gated semiconductor devices, and more particularly to a method of doping a neck region of a MOS-gated semiconductor device in which the neck region is doped through a previously deposited polysilicon gate.

With reference to FIG. 1, MOS-gated semiconductor devices may include a body region 12 of a first semiconductor type in a substrate 14 of a second semiconductor type. Source regions 16 are provided in the body region 12. When the device is turned on by gate 18, current flows through a channel region 20 and then through a neck region 22 (also known as the JFET region). The current in such device proceeds vertically through the lightly doped substrate region, drain 24, which supports the voltage carried by the device to, for example, a drain electrode 44 (FIG. 3e). It is understood that such devices in the prior art include various configurations of the substrate regions, which may include buffer areas and regions having different dopant concentrations. Because the neck region 22 is a relatively small area, it may account for a large portion of the total resistive voltage drop across the device when the device is conducting. To minimize this resistance, it is known to dope the neck region 22 heavily to a depth consistent with maintaining the breakdown voltage. An example of such structures in the prior art may be found in U.S. Pat. No. 4,376,286. To this end, it is desirable that doping of the neck region 22 be (a) comparable to the depth of the body region 12, and (b) heavy compared to the drain 24.

With reference now to FIGS. 2a, 2b, 2c and 2d, it is known in the prior art to manufacture MOS-gated semiconductor devices using a process that starts with the substrate 14 that has been doped to the proper resistivity for the voltage supporting capability of the device. As seen in FIG. 2b, the N dopant for the neck region 22 is implanted into the substrate 14 prior to deposition of the polysilicon gate 18 and prior to formation of the body regions 12. In subsequent steps (FIGS. 2c and 2d), the gate oxide layer 26 is grown, the polysilicon gate 18 is deposited and etched to an appropriate pattern, the body region 12 is implanted and diffused into the drain 24 and the source regions 16 are implanted. In this process, the dopant in the neck region 22 is exposed to the same temperature history as the body region 12 causing the dopant in neck region 22 to diffuse relatively deeply into the drain 24 (as may be seen by the relative depths of the region 22 in FIGS. 2b and 2c). Because the neck region 22 is diffused so deeply, it is often important that the dopant concentration must be controlled to avoid a breakdown voltage reduction, although the cost for low dopant concentration is increased resistance (higher voltage drop across the device). Thus, it has been necessary to trade voltage drop for breakdown voltage.

Further, in such devices a vertical bipolar transistor exists that includes the source region 16, body region 12 and drain 24 (an NPN transistor). This is a parasitic transistor that is subject to turn-on when the device is operating and if turned on, may cause the device to self-destruct. As is known, the parasitic transistor is less likely to turn on when its gain is lowered. The gain of the parasitic transistor is lowered when the dopant concentration in the body region 12 is increased. However, when the dopant concentration of the body region 12 is increased, the threshold voltage of the device increases. (Threshold voltage is the voltage at which the channel 20 of FIG. 1 is formed.) Most devices of this type have a threshold voltage that is prespecified and known to the user of the device and which cannot be arbitrarily changed. For example, logic level devices may have a threshold voltage of about one and one-half volts. Such devices can be made more rugged by increasing the body dopant concentration, however a much higher threshold voltage would result, rendering them of little use in many common circuits that operate at 5 volts or less.

Accordingly, it is an object of the present invention to provide a novel method of manufacturing a MOS-gated semiconductor device in which a heavily doped portion of the neck region is kept shallow so that it may have a dopant concentration higher than in prior art devices without affecting breakdown voltage.

It is a further object of the present invention to provide a novel method of manufacturing a MOS-gated semiconductor device in which the neck region is doped through the previously deposited gate.

It is yet a further object of the present invention to provide a novel method of improving the ruggedness of a MOS-gated semiconductor device by decreasing the likelihood that a parasitic vertical bipolar transistor in the device will be turned on.

It is still a further object of the present invention to provide a novel method of establishing a threshold voltage level in a MOS-gated semiconductor device by implanting a dopant through a previously deposited gate and into a surface layer of a body region in the device.

It is another object of the present invention to provide a MOS-gated semiconductor device made by a process in which the neck region of the device is doped through a previously deposited gate.

These and many other objects and advantages will be readily apparent to one skilled in the art to which the invention pertains from a perusal of the claims, the appended drawings and the following detailed description of preferred embodiments.

DESCRIPTION OF PREFERRED EMBODIMENTS

Figure 1:
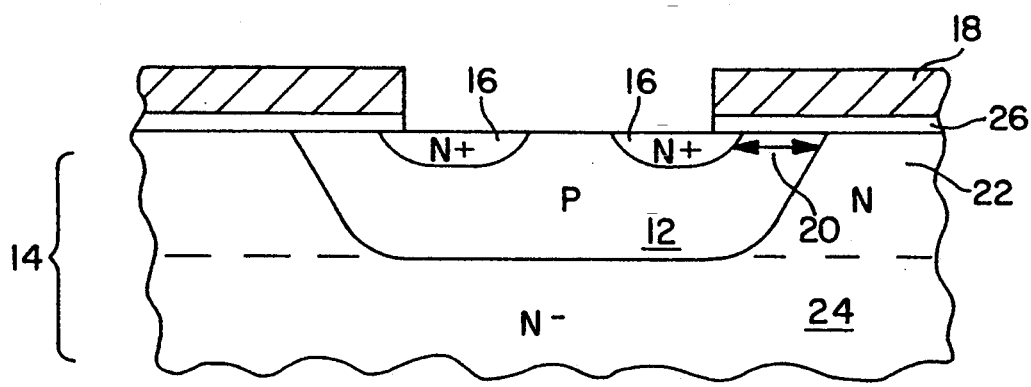
FIG. 1 is a pictorial representation of a partial vertical cross-section of a MOS-gated semiconductor device of the prior art.
Figure 2A:
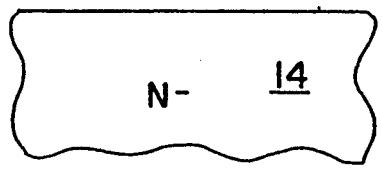
FIGS. 2a, 2b, 2c and 2d are pictorial representations of partial vertical cross-sections of the device illustrated in FIG. 1 showing steps in the manufacturing process.
Figure 2B:
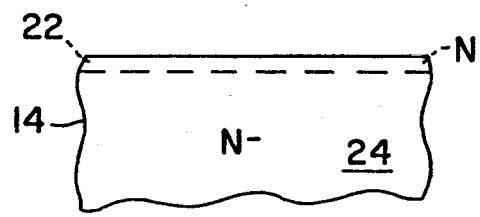
Figure 2C:
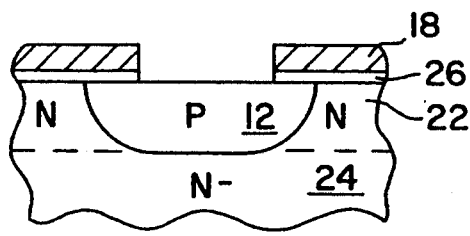
Figure 2D:
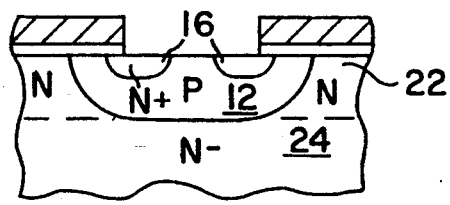
Figure 3E:
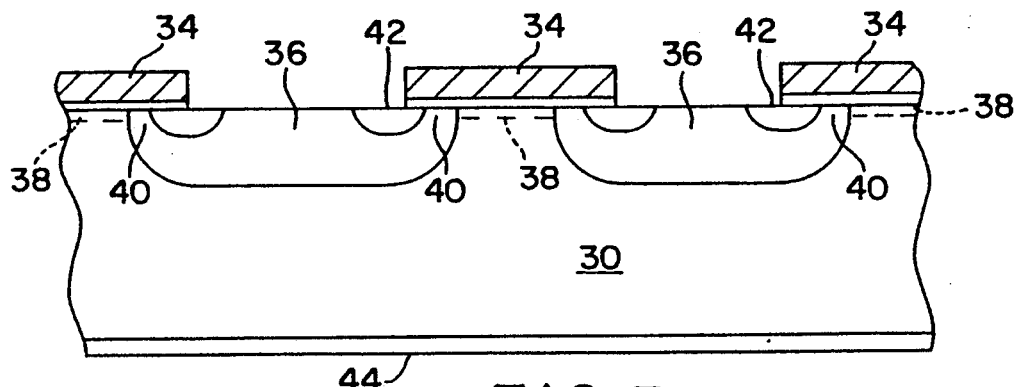
FIGS. 3a, 3b, 3c, 3d and 3e are pictorial representations of partial vertical cross-sections of a MOS-gated semiconductor device illustrating the steps of the method of the present invention.
Figure 3A:
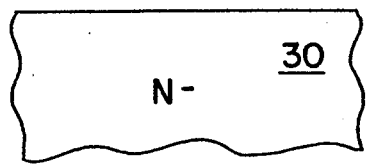

The method of the present invention may be seen with reference to FIGS. 3a, 3b, 3c, 3d and 3e. As seen in FIG. 3a, the starting wafer is the same as in a prior art. That is, a silicon substrate 30 is doped to a concentration so that its resistivity is appropriate for the blocking voltage capability of the device.

Figure 3B:
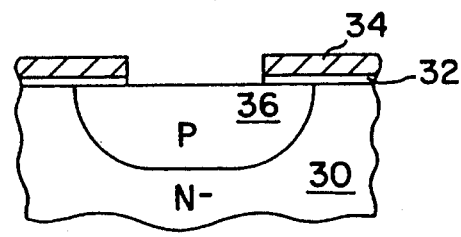
Figure 3C:
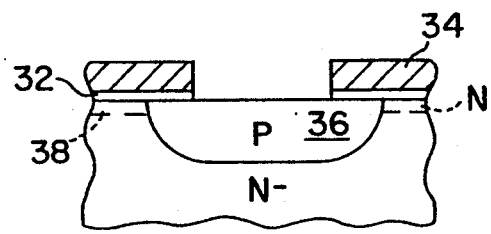

As shown in FIG. 3b, a gate oxide 32 is grown on the wafer using standard techniques and a polysilicon gate 34 is thereafter deposited and etched as appropriate for the pattern used in the device. A dopant for a body region 36 of the type opposite the semiconductor type of the substrate 30) is then driven into the substrate 30 to an appropriate depth using known diffusion techniques.

In the next step (FIG. 3c) and in contrast to the prior art, the neck region 38 dopant is implanted with enough energy to go through the gate 34 and gate oxide 32 and into the substrate 30 therebeneath. The neck region dopant is also implanted into the surface of the base region 36 thereby partially counter-doping the body dopant in the yet-to-be-formed channel regions 40 (FIG. 3e).

Figure 3D:
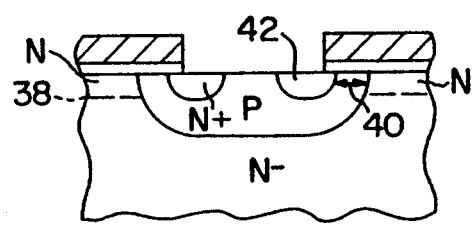

Finally, as seen in FIG. 3d, the source regions 42 are implanted and diffused and driven to an appropriate depth using known diffusion techniques.

Alternatively, the step of implanting the neck region 38 dopant may take place after the source regions 42 are formed.

With reference to FIG. 3e, another representation of the vertical cross section of the device of FIG. 3d depicts two adjacent structures and is typical, but not required.

In the method of the present invention, the dopant concentration near the top of the neck region 38 (where the area for current flow is small) can be higher than in the prior art because the dopant is not subsequently driven as deeply into the substrate.

As will be apparent to those skilled in the art, counter-doping the surface of the body region reduces the threshold voltage of the device. This reduction provides a further advantage of the present invention because the threshold voltage of the device may be adjusted to meet a specific and predetermined value while simultaneously increasing device ruggedness. One or both of the gate oxide thickness and body dopant can be increased above prior art levels to improve device ruggedness. A device becomes more rugged when it is operating at high current and high voltage, such as in the active region at the limits of the safe operating area (SOA), or in the avalanche breakdown region during unclamped inductive switching (UIS), or when operating with rapidly rising voltages (high dv/dt).

For example, the threshold voltage may be brought to a desired level by increasing the body dopant to bring the concentration of dopant at the top surface of the body region back up to where it would have been without the counter-doping. This allows the dopant concentration deep within the body to be higher than it was before, thereby reducing the gain of the parasitic bipolar transistor that may be formed in the device when it is conducting and decreasing the likelihood that it will turn on, thereby improving the device's ruggedness.

Alternatively, the reduced threshold voltage may be brought back up to a desired value by increasing the gate oxide thickness. This technique provides the advantage of producing a more durable and rugged gate oxide.

While preferred embodiments of the present invention have been described, it is to be understood that the embodiments described herein, such as the steps of FIG. 3, are illustrative only and that the scope of the invention is to be defined solely by the appended claims when accorded a full range of equivalence, many variations and modifications naturally occurring to those skilled in the art from a perusal hereof. Further, the method of the present invention will find application in either P or N type devices and in a number of MOS-gated semiconductor devices such as those devices described in U.S. Pat. Nos. 3,831,187, 4,364,073 and 4,532,534.

We claim:

1. A method of doping a neck region of a first conductivity type between adjacent body regions of a second conductivity type in a MOS-gated semiconductor device comprising the steps of:
    a. creating a gate insulation layer on a surface of the device;
    b. creating a polysilicon gate on the gate insulation layer;
    c. doping the neck region to decrease device on-resistance by implanting dopant of the first conductivity type through said gate and said gate insulation layer.

2. The method of claim 1 wherein said step of implanting counterdopes said body region in a channel region thereof, reducing the threshold voltage of the device.

3. The method of claim 2 further comprising the step of doping the body region, thereby increasing the threshold voltage of the device.

4. A method of decreasing on-resistance in a MOS-gated semiconductor device having a neck region of a first conductivity type between adjacent body regions of a second conductivity type and a polysilicon gate overlying the neck region comprising the step of doping the neck region through the gate so that the conductivity of the neck region is higher than the conductivity of an underlying substrate, thereby decreasing on-resistance without affecting device breakdown voltage.

5. The method of claim 4 wherein said step of doping comprises the step of implanting dopant with sufficient energy to penetrate the gate, a dielectric layer underlying the gate and the neck region.

6. The method of claim 5 wherein the dopant penetrates the neck region to a depth less than a depth to which the body regions extend.

7. In a method of doping a MOS-gated semiconductor device in which a neck region of a first conductivity type is formed between adjacent body regions of a second conductivity type in a substrate of the first conductivity type by doping the neck region and the body regions in separate doping steps, wherein the dopant concentration in the neck region is higher than the dopant concentration of the substrate so that the on-resistance of the device is decreased from that if the dopant concentration of the neck region and substrate had been the same, and in which a gate and underlying gate oxide layer are formed over the neck region and peripheral channel portions of the body regions, the improvement comprising the steps of:
    a. forming the gate oxide layer and the gate on a surface of the device;
    b. doping the body regions by diffusing dopant of the second conductivity type into the surface of the device; and
    c. doping the neck region by implanting dopant of the first conductivity type through the gate and gate oxide layer without exposing the neck region dopant to the body region dopant diffusion so that the higher dopant concentration of the neck region is not further diffused into the substrate, and so that the on-resistance of the device is decreased from that if the dopant concentration of the neck region and substrate had been the same, without affecting device breakdown voltage.

* * * * *